(12) United States Patent
Chen et al.

(10) Patent No.: US 10,827,645 B2
(45) Date of Patent: Nov. 3, 2020

(54) FAN EXPANSION CARD AND MOTHERBOARD MODULE

(71) Applicant: GIGA-BYTE TECHNOLOGY CO., LTD., New Taipei (TW)

(72) Inventors: Hung-Cheng Chen, New Taipei (TW); Tse-Hsien Liao, New Taipei (TW); Chun-Chien Lee, New Taipei (TW); Chih-Hua Ke, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/519,012

(22) Filed: Jul. 23, 2019

(65) Prior Publication Data

US 2020/0053910 A1 Feb. 13, 2020

(30) Foreign Application Priority Data

Aug. 10, 2018 (TW) .............................. 107127965 A

(51) Int. Cl.
*H05K 7/20* (2006.01)
*G06F 1/18* (2006.01)
*G06F 1/20* (2006.01)

(52) U.S. Cl.
CPC ......... *H05K 7/20145* (2013.01); *G06F 1/184* (2013.01); *G06F 1/185* (2013.01);
(Continued)

(58) Field of Classification Search
CPC . G06F 1/20; G06F 1/181; G06F 1/185; G06F 1/206; G06F 1/183; G06F 1/184;
(Continued)

(56) References Cited

U.S. PATENT DOCUMENTS 6,349,029 B1* 2/2002 Leman .................... G06F 1/18
16/221
6,671,177 B1* 12/2003 Han ...................... H01L 23/467
165/80.3
(Continued)

FOREIGN PATENT DOCUMENTS

| CN | 2824121 | 10/2006 |
|----|---------|---------|
| CN | 201662760 | 12/2010 |

(Continued)

OTHER PUBLICATIONS

Gadgetmix, "Anidees AI-GP-CL8 RGB Fans For Graphic Cards." retrieved on Oct. 30, 2019, Available at: http://gadgetmix.com/anidees-ai-gp-cl8-rgb-fans-for-graphic-cards/1012/.
(Continued)

*Primary Examiner* — Adam B Dravininkas
(74) *Attorney, Agent, or Firm* — JCIPRNET

(57) ABSTRACT

A fan expansion card includes a first circuit board and at least one first fan. The first circuit board has at least one through-hole. The first circuit board includes a first connection port having a PCI-E interface. Each of the first fans is disposed at a position on the first circuit board corresponding to the through-hole. The first fan is electrically connected to the first circuit board, wherein an airflow generated by each of the first fans passes through the corresponding through-hole. A motherboard module having the above fan expansion card is further provided.

15 Claims, 8 Drawing Sheets

(52) U.S. Cl.
CPC .............. *G06F 1/186* (2013.01); *G06F 1/206* (2013.01); *G06F 2213/0026* (2013.01)

(58) Field of Classification Search
CPC .............. H01L 23/467; H01L 23/4093; H01L 2023/4062; H05K 7/20172; H05K 7/20145; H05K 7/20736; H05K 7/20154; H05K 7/20727; H05K 7/20163; H05K 1/0203; H05K 7/20209; H05K 7/20572; H05K 5/03; H05K 7/2049; H05K 7/20009; H05K 7/2039; H05K 13/00; H05K 1/0272; H05K 7/20563; H05K 7/20581; H05K 7/1457; H05K 7/20136
See application file for complete search history.

(56) References Cited

U.S. PATENT DOCUMENTS

| | | | | |
|---|---|---|---|---|
| 7,382,621 | B2* | 6/2008 | Peng | H01L 23/427 |
| | | | | 165/121 |
| 9,986,632 | B2* | 5/2018 | Shih | H05K 1/0203 |
| 2002/0097559 | A1* | 7/2002 | Inoue | G06F 1/203 |
| | | | | 361/688 |
| 2004/0196630 | A1* | 10/2004 | Wu | H05K 7/1461 |
| | | | | 361/695 |
| 2007/0000649 | A1* | 1/2007 | Peng | H05K 7/20172 |
| | | | | 165/121 |
| 2007/0230125 | A1* | 10/2007 | Lo | H01L 23/467 |
| | | | | 361/697 |
| 2009/0147476 | A1* | 6/2009 | Han | G06F 1/20 |
| | | | | 361/697 |
| 2010/0165573 | A1* | 7/2010 | Fang | G06F 1/20 |
| | | | | 361/697 |
| 2012/0087088 | A1* | 4/2012 | Killion | F28F 3/12 |
| | | | | 361/697 |
| 2012/0300386 | A1* | 11/2012 | Yang | G06F 1/185 |
| | | | | 361/679.32 |
| 2013/0265713 | A1* | 10/2013 | Crane | G06F 1/20 |
| | | | | 361/679.51 |

FOREIGN PATENT DOCUMENTS

| | | |
|---|---|---|
| CN | 207571657 | 7/2018 |
| JP | S6041096 | 3/1985 |
| JP | H062780 | 1/1994 |
| JP | H09199881 | 7/1997 |
| TW | 516763 | 1/2003 |
| TW | M385729 | 8/2010 |
| TW | 1330314 | 9/2010 |
| TW | 201325418 | 6/2013 |
| TW | 1424122 | 1/2014 |

OTHER PUBLICATIONS

"Search Report of Europe Counterpart Application", dated Nov. 7, 2019, p1-p8.
"Office Action of Japan Counterpart Application", dated Jul. 14, 2020, p1-p4.

* cited by examiner

FAN EXPANSION CARD AND MOTHERBOARD MODULE

CROSS-REFERENCE TO RELATED APPLICATION

This application claims the priority benefit of Taiwan application serial no. 107127965, filed on Aug. 10, 2018. The entirety of the above-mentioned patent application is hereby incorporated by reference herein and made a part of this specification.

BACKGROUND OF THE INVENTION

Field of the Invention

The invention relates to an expansion card and a motherboard module, and more particularly, to a fan expansion card and a motherboard module.

Description of Related Art

In recent years, with the development of the technology industry, the demand for the function and operating speed of electronic devices has increased, and accordingly the number of electronic components required has also increased. The increase in the number of electronic components and the operating speed of the components both result in high heat inside the electronic device, which affects the operating efficiency of the electronic device.

In electronic components such as central processors, expansion cards (such as display cards, etc.), or transistors (such as power MOSFETs) that often generate high heat in the electronic device (such as a computer), the heat energy generated is significantly higher than in the past due to the continuous increase in operating speed. Most of the central processors and display cards in the prior art are equipped with heat-dissipating components (such as cooling fans) to reduce the temperature. Generally, the power source of the fans installed on the motherboard is 3 pin or 4 pin fan power supply slots on the motherboard. However, the number of such fan power supply slots is limited, and the fans are also limited by the positions of the fan power supply slots and may not be compatible with power MOSFETs and other electronic components that generate heat (for example, memory chips or the like), and accordingly the heat generated is also more likely to accumulate inside the electronic device. Therefore, in the operating process of the electronic device, how to quickly discharge the internal heat thereof to the outside has become an actively researched topic for relevant manufacturers.

SUMMARY OF THE INVENTION

The invention provides a fan expansion card, which does not occupy the 3 pin power supply slot or 4 pin fan power supply slot on the motherboard, and has a good heat dissipation effect.

The invention provides a motherboard module having the fan expansion card.

A fan expansion card of the invention includes a first circuit board and at least one first fan. The first circuit board has at least one through-hole. The first circuit board includes a first connection port having a PCI-E interface. Each of the first fans is disposed at a position on the first circuit board corresponding to the through-hole. The first fan is electrically connected to the first circuit board, wherein an airflow generated by each of the first fans passes through the corresponding through-hole.

In an embodiment of the invention, in the fan expansion card, the first connection port is a PCI-E×1, PCI-E×2, PCI-E×4 or PCI-E×8 connection port.

In an embodiment of the invention, in the fan expansion card, an area of each of the through-holes is between 50% and 100% of a size of the corresponding first fan.

In an embodiment of the invention, in the fan expansion card, the at least one through-hole of the first circuit board includes a plurality of through-holes, the at least one first fan includes a plurality of first fans, and the first fans are respectively disposed at positions corresponding to the through-holes.

In an embodiment of the invention, in the fan expansion card, the through-holes are arranged in a row, in a staggered arrangement, or in an array configuration.

In an embodiment of the invention, in the fan expansion card, sizes of the through-holes are the same or different, and sizes of the first fans are the same or different respectively corresponding to the sizes of the configured through-holes.

In an embodiment of the invention, in the fan expansion card, the at least one through-hole of the first circuit board includes one through-hole, the at least one first fan includes a plurality of first fans, an area of the through-hole is between 50% and 200% of a total size of the first fans, and the first fans are disposed at positions corresponding to the through-holes.

In an embodiment of the invention, in the fan expansion card, the first circuit board further includes a control chip electrically connected to the first connection port and the first fan, and the control chip is adapted to control a rotating speed of the first fan.

In an embodiment of the invention, in the fan expansion card, the first circuit board further includes an external power supply slot electrically connected to the control chip.

In an embodiment of the invention, in the fan expansion card, the first circuit board further includes a light source control circuit electrically connected to the first connection port.

A motherboard module of the invention includes a motherboard body, a central processor, and at least any of the fan expansion cards above. The motherboard body includes a central processor slot, a plurality of PCI-E slots located on one side of the central processor slot, and a plurality of transistors disposed beside the central processor slot. The central processor is disposed in the central processor slot. When each of the first fan in any of the fan expansion cards above is in operation, an airflow generated by each of the first fans passes through the corresponding through-hole and is adapted to be blown toward a direction of the central processor and the transistors.

In an embodiment of the invention, in the motherboard module, the at least one fan expansion card includes one fan expansion card, the fan expansion card is inserted on the PCI-E slot closest to the central processor slot, and an airflow generated by the at least one first fan of the fan expansion card is blown toward the direction of the central processor and the transistors.

In an embodiment of the invention, the motherboard module further includes a function expansion card. The function expansion card includes a second circuit board, wherein the second circuit board includes a second connection port, the second connection port has a PCI-E interface, the function expansion card is disposed on one of the PCI-E slots, and the PCI-E slot in which the function expansion card is inserted is not the PCI-E slot closest to the central processor slot.

In an embodiment of the invention, the at least one fan expansion card includes two fan expansion cards, the function expansion card is located between the two fan expansion cards, one of the fan expansion cards is inserted on the PCI-E slot closest to the central processor slot, an airflow generated by the at least one first fan of the fan expansion card is blown toward the direction of the central processor and the transistors, the other fan expansion card is inserted on the PCI-E slot farthest from the central processor slot, and an airflow generated by the at least one first fan of the fan expansion card is blown toward a direction of the function expansion card.

In an embodiment of the invention, the function expansion card includes a second fan disposed on the second circuit board, the second fan blows toward a direction of the second circuit board, and an airflow generated by the second fan flows along a surface of the second circuit board.

In an embodiment of the invention, the second circuit board of the function expansion card includes a front surface and a back surface opposite to each other, the second fan is disposed on the front surface, the back surface faces the fan expansion card, and an airflow driven by the first fan of the fan expansion card flows through the back surface of the second circuit board of the function expansion card.

Based on the above, the first connection port of the fan expansion card of the invention is a PCI-E interface connection port, which may be inserted on the PCI-E slot of the motherboard to receive power. That is, the motherboard may power the first fan of the fan expansion card via the PCI-E slot. In this way, the fan expansion card does not need to occupy the 3 pin power supply slot or 4 pin fan power supply slot on the motherboard, such that the motherboard module has more heat dissipation options. In addition, the first circuit board of the fan expansion card of the invention has a through-hole, and the first fan is disposed at a position on the first circuit board corresponding to the through-hole, so that the airflow generated by the first fan may pass through the corresponding through-hole. In other words, the air blown by the fan expansion card may travel along the normal direction of the first circuit board. When the fan expansion card of the invention is applied on the motherboard, if the PCI-E slot in which the fan expansion card is inserted is located beside the central processor slot and the transistors, the air blown by the fan expansion card is adapted to be blown toward the direction of the central processor and the transistors to cool the central processor and the transistors. In addition, in the motherboard module of the invention, the fan expansion card may not only dissipate heat from a main heat source such as a central processor, but may also dissipate heat from a secondary heat source such as a transistor to achieve a good heat dissipation effect.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
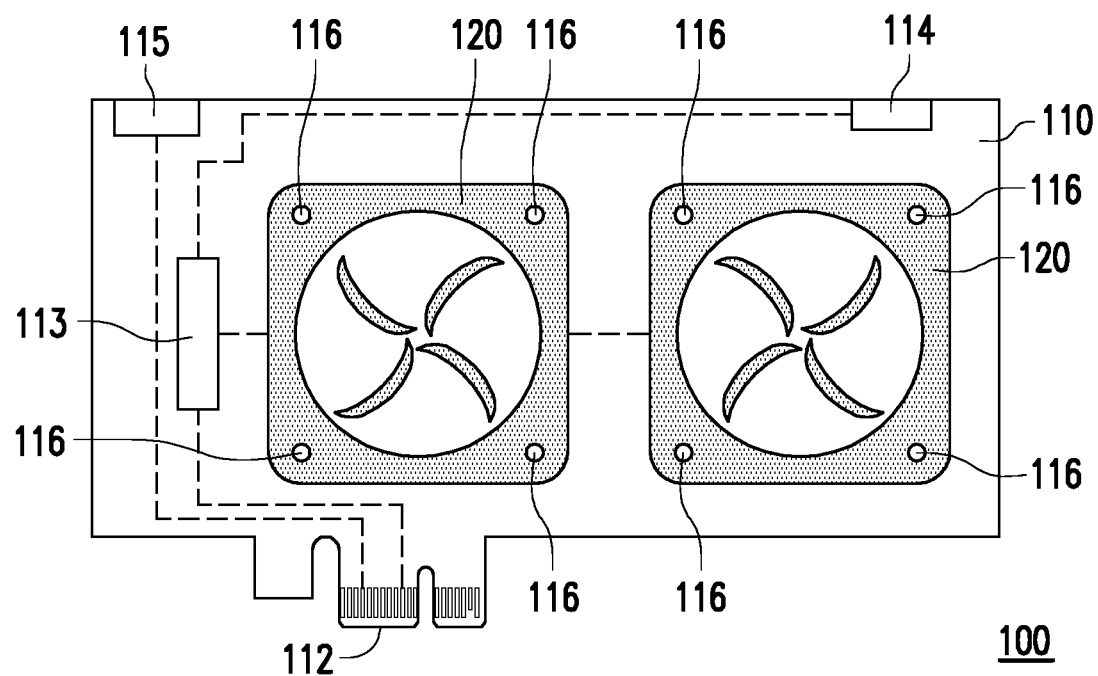
FIG. 1 is a schematic diagram of a fan expansion card in accordance with an embodiment of the invention.
Figure 2:
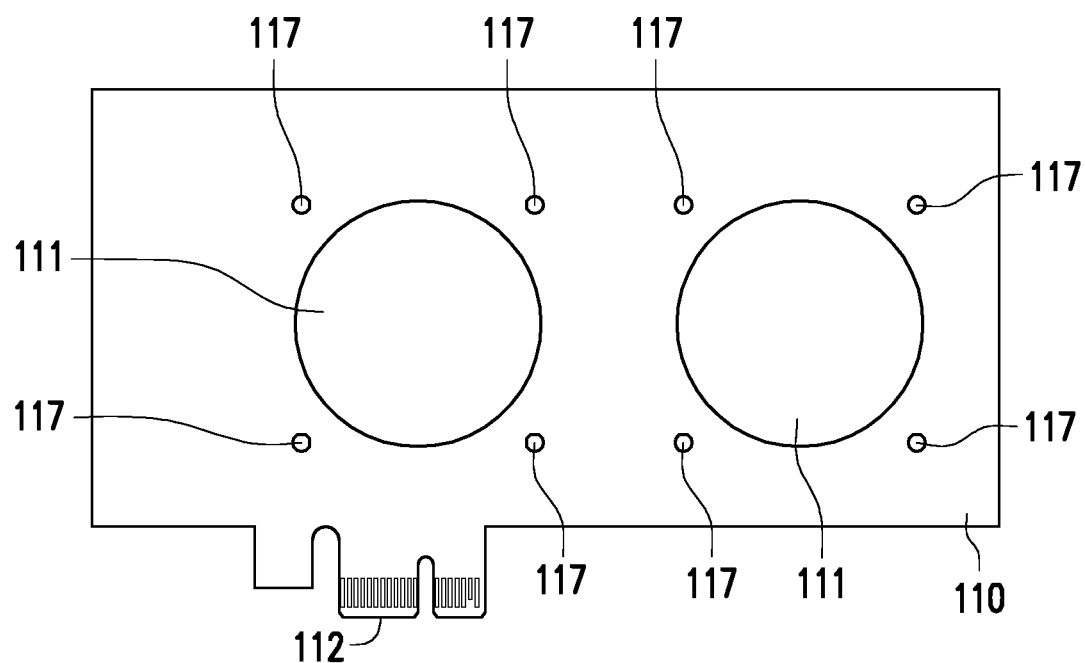
FIG. 2 is a schematic diagram of a first circuit board of the fan expansion card of FIG. 1.

FIG. 1 is a schematic diagram of a fan expansion card in accordance with an embodiment of the invention. FIG. 2 is a schematic diagram of a first circuit board of the fan expansion card of FIG. 1. It is to be noted that FIG. 2 is a schematic diagram of first fans 120 removed from a first circuit board 110 in FIG. 1, in which a control chip 113, an external power supply slot 114, and a light source control circuit 115 and the like are omitted to more clearly illustrate through-holes 111 on the first circuit board 110.

Referring to FIG. 1 to FIG. 2, a fan expansion card 100 of the present embodiment includes the first circuit board 110 and at least one first fan 120. In the present embodiment, the first circuit board 110 includes a first connection port 112. The first connection port 112 is a PCI-E interface. In the present embodiment, the first connection port 112 is a PCI-E×1 connection port, but in other embodiments, the first connection port 112 may also be a PCI-E×2, PCI-E×4, or PCI-E×8 connection port.

Referring to FIG. 2, the first circuit board 110 has at least one through-hole 111. In the present embodiment, the number of the through-hole 111 is, for example, two. Of course, in other embodiments, the number of the through-hole 111 may be one or more than two, and is not limited thereto.

In the present embodiment, the at least one first fan 120 is disposed at a position on the first circuit board 110 corresponding to the at least one through-hole 111. In the present embodiment, the number of the first fan 120 corresponds to the number of the through-hole 111, for example, two. The two first fans 120 are respectively disposed beside the two through-holes 111. Of course, in other embodiments, the number of the first fan 120 is not limited thereto, and the number of the first fan 120 may also not correspond to the number of the through-hole 111.

In the present embodiment, the first fans 120 are electrically connected to the first connection port 112 of the first circuit board 110. The first connection port 112 of the fan expansion card 100 is a PCI-E interface connection port that may be inserted on a PCI-E slot 214 (FIG. 10) of a motherboard body 210 (FIG. 10) to receive power. That is, when the fan expansion card 100 is assembled on the motherboard body 210, the motherboard body 210 may power the first fans 120 of the fan expansion card 100 via the PCI-E slot 214. In this way, the fan expansion card does not occupy the 3 pin fan power supply slot (not shown) or 4 pin fan power supply slot (not shown) on the motherboard body 210.

In addition, in the present embodiment, the first fans 120 are fixed on the first circuit board 110 by locking. More specifically, in the present embodiment, the first circuit board 110 includes a screw hole 117. The first fans 120 are fixed on the screw hole 117 of the first circuit board 110 by a screw 116. Of course, the manner in which the first fans 120 are fixed to the first circuit board 110 is not limited thereto. In other embodiments, the first fans 120 may also be fixed on the first circuit board 110 by other means such as snapping or bonding.

In the present embodiment, the area of the through-holes 111 is between 50% and 100% of the size of the corresponding first fans 120, so that most of the airflow generated by the first fans 120 may pass through the through-holes 111. When the first fans 120 are in operation, the airflow generated by the first fans 120 passes through the through-holes 111 from one side of the first circuit board 110 and flows through the other side of the first circuit board 110. In the present embodiment, the airflow direction of the fan expansion card 100 is, for example, parallel to the normal direction of the first circuit board 110, and may be blown toward the front or back side of the first circuit board 110. Of course, the relationship between the position and number of the through-holes 111 of the first circuit board 110, the area of the through-holes 111, and the size of the first fans 120 is not limited thereto. Other forms of the first circuit board are described below.

Figure 3:
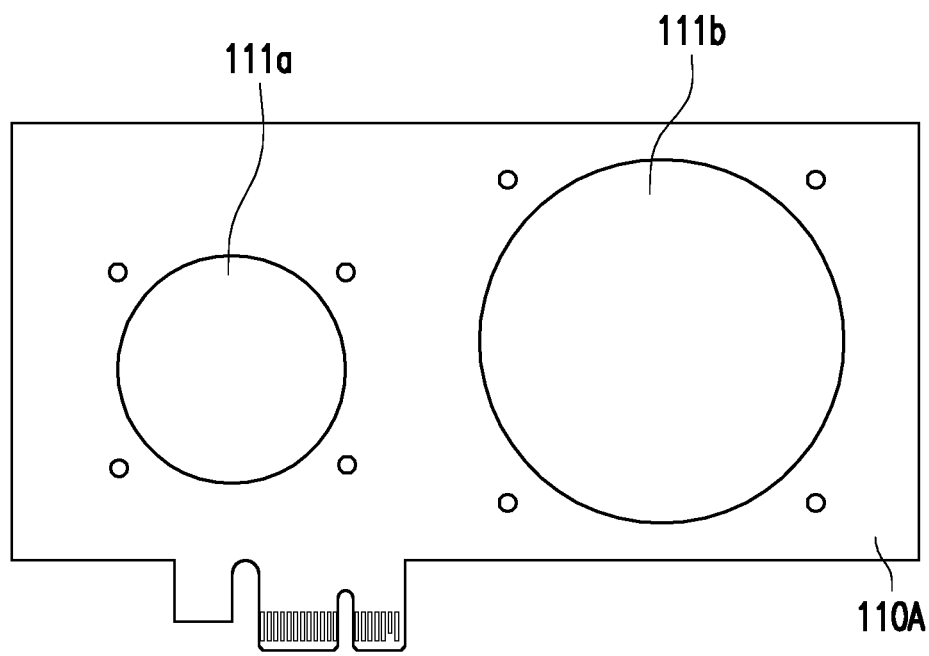
FIG. 3 to FIG. 6 are schematic diagrams of a first circuit board of a fan expansion card in accordance with a plurality of embodiments of the invention.

FIG. 3 to FIG. 6 are schematic diagrams of a first circuit board of a fan expansion card in accordance with a plurality of embodiments of the invention. FIG. 7 is a schematic diagram of a fan expansion card adopting the first circuit board of FIG. 6. Referring to FIG. 3, the main difference between a first circuit board 110A of FIG. 3 and the first circuit board 110 of FIG. 2 is that the size of each of the through-holes 111 in FIG. 2 is the same, and the sizes of through-holes 111a and 111b in FIG. 3 are not the same. More specifically, the size of the through-hole 111a is smaller than the size of the through-hole 111b. It is worth mentioning that the size of the fan disposed in the through-hole 111a may also be smaller than the size of the fan disposed in the through-hole 111b. In other words, the designer may first determine the number and size of the fan on the fan expansion card via the position of the heat source and the intensity of the required heat dissipation, and then determine the position and size of the through-holes on the first circuit board to obtain different forms of the first circuit boards 110 and 110A.

Figure 4:
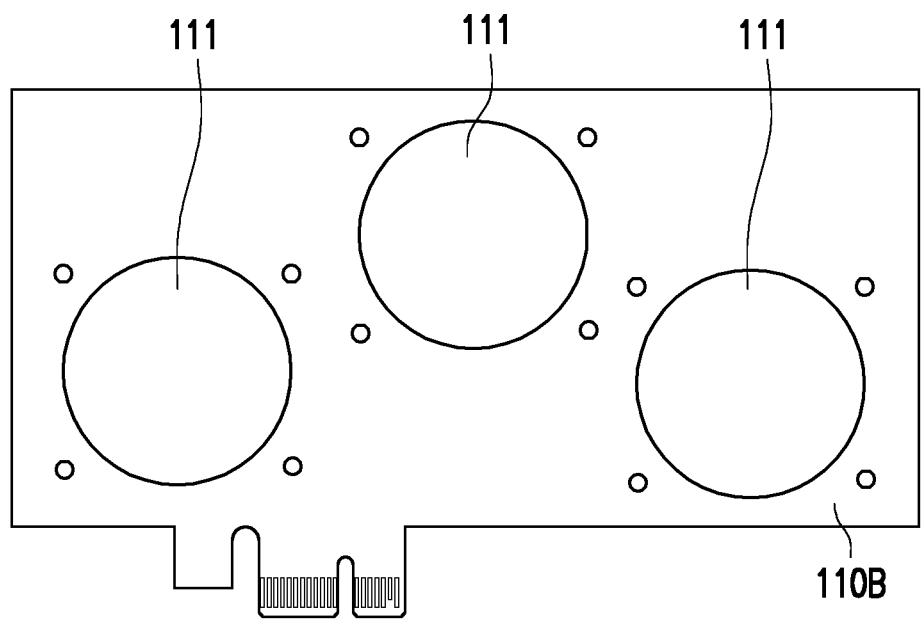

Referring to FIG. 4, the main difference between a first circuit board 110B of FIG. 4 and the first circuit board 110 of FIG. 2 is that the number of the through-holes 111 in FIG. 4 is three, and the positions of the through-holes 111 are in a staggered arrangement. That is to say, the number and configuration of the through-holes on the first circuit board are not limited.

Figure 5:
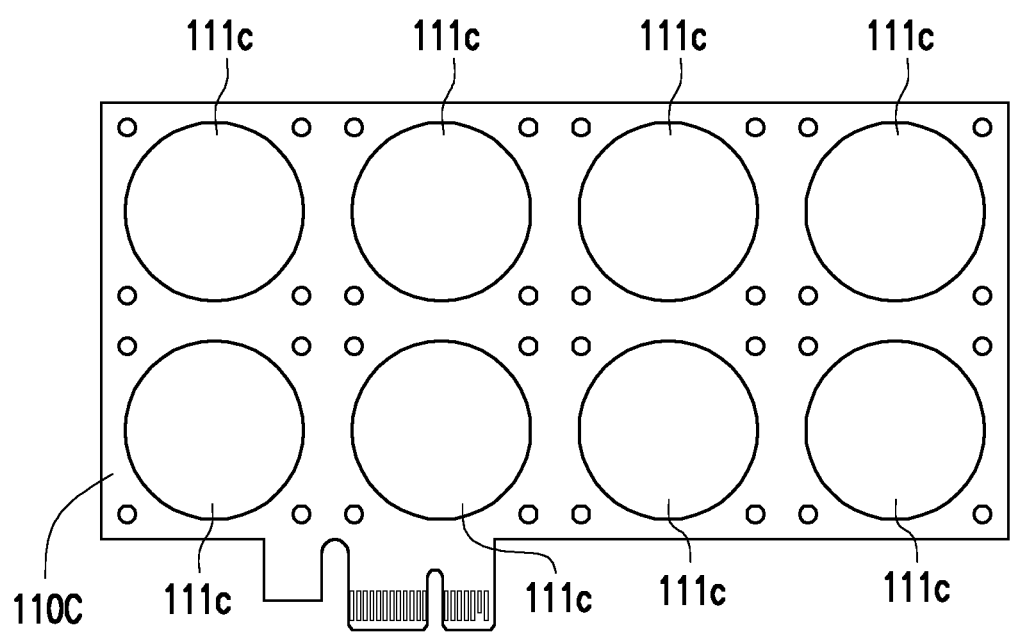

Referring to FIG. 5, in the present embodiment, the positions of through-holes 111 of a first circuit board 110C are arranged in an array configuration. In the present embodiment, the number of the through-holes 111 on the first circuit board 110C is eight. Of course, in other embodiments, the number of the through-holes 111 on the first circuit board 110C is not limited thereto. In addition, in other embodiments, the arrangement of the through-holes 111 on the first circuit board 110C may also be an irregular arrangement, and is not limited to a straight line, staggered, or array arrangement.

In the above embodiment, the size of the through-holes of the first circuit board is between 50% and 100% of the size of the fans, that is, the size of the through-holes of the first circuit board is less than or equal to the size of the fans, but the relationship between the size of the through-holes of the first circuit board and the size of the fans is not limited thereto.

Figure 6:
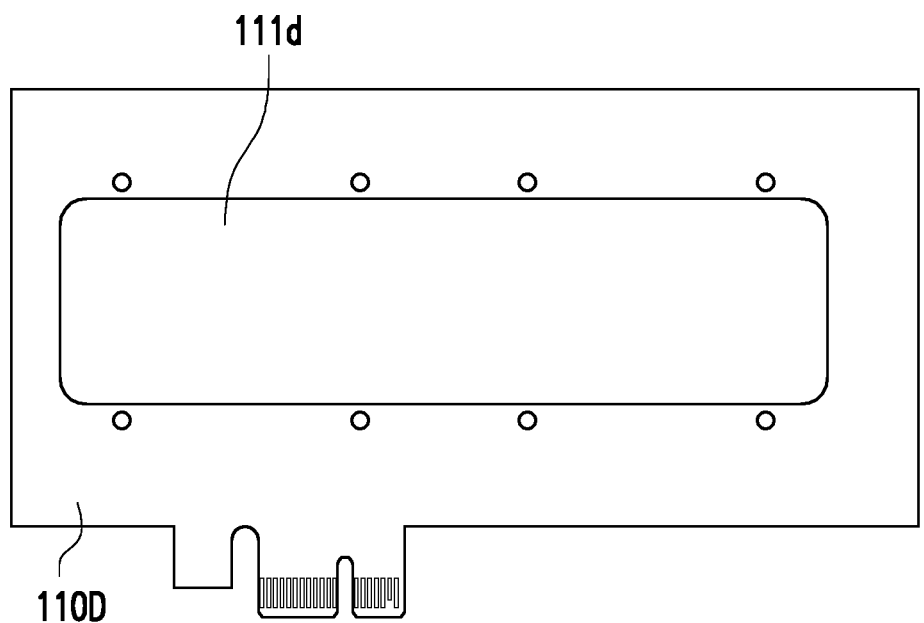
Figure 7:
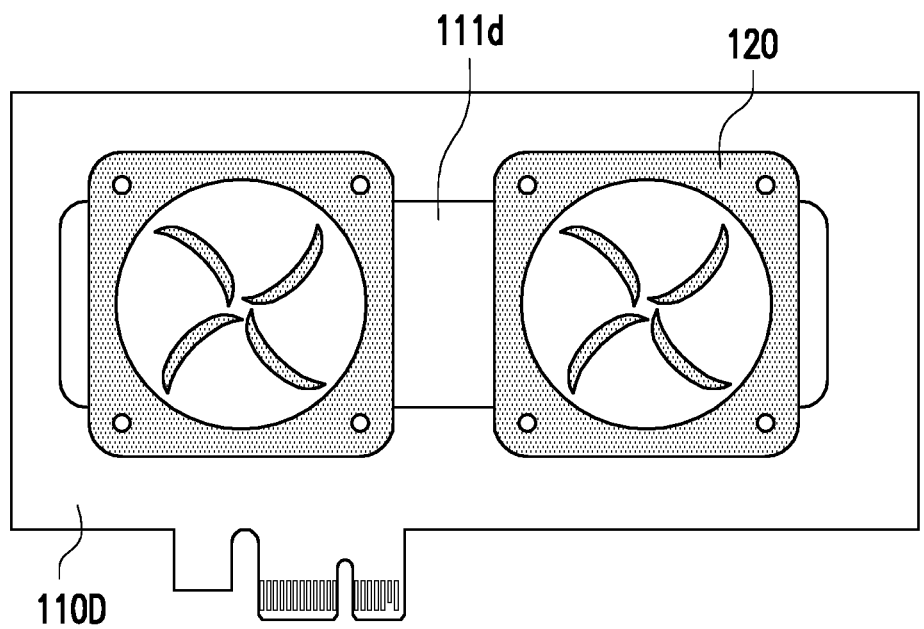
FIG. 7 is a schematic diagram of a fan expansion card adopting the first circuit board of FIG. 6.

Referring to FIG. 6 and FIG. 7, in the present embodiment, the size of a through-hole 111d of a first circuit board 110D may be greater than the size of the first fans 120. For example, the size of the through-hole of the first circuit board is between about 100% and 300% of the size of a single fan. Still alternatively, the area of the through-hole is between 50% and 200% of the total size of the first fans. In the present embodiment, the number of the first fans 120 is not equal to the number of the through-hole 111d. More specifically, two first fans 120 are disposed beside a single through-hole 111d. The air generated by the two first fans 120 passes through the same through-hole 111d. Of course, in other embodiments, the proportion relationship between the size of the through-hole 111d and the size of the first fans 120 is not limited thereto, and the number relationship between each of the through-hole 111d and the configured first fans 120 is not limited thereto. Further, in the present embodiment, the shape of the through-hole 111d is a rectangle. Of course, in other embodiments, the shape of the through-hole 111d may also be an ellipse, a polygon, or any other shape.

Figure 8:
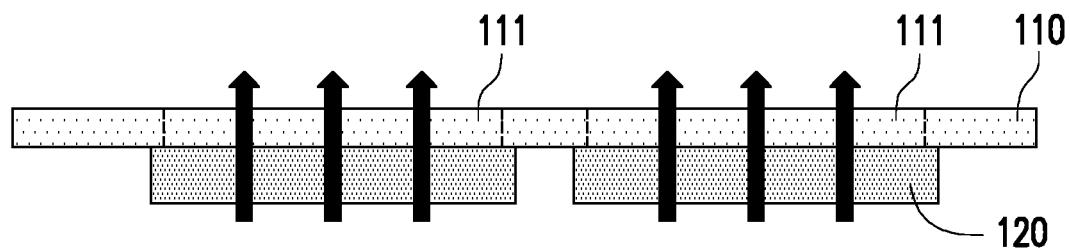
FIG. 8 is a top view of the fan expansion card of FIG. 1.

FIG. 8 is a top view of the fan expansion card of FIG. 1. Referring to FIG. 1, FIG. 2, and FIG. 8, in the present embodiment, since the size of the through-holes 111 of the first circuit board 110 is slightly less than the size of the first fans 120, the first fans 120 are disposed at positions on one of the surfaces of the first circuit board 110 corresponding to the through-holes 111, and the airflow generated by the first fans 120 (as indicated by the bold arrow) passes through the through-holes 111.

Figure 9:
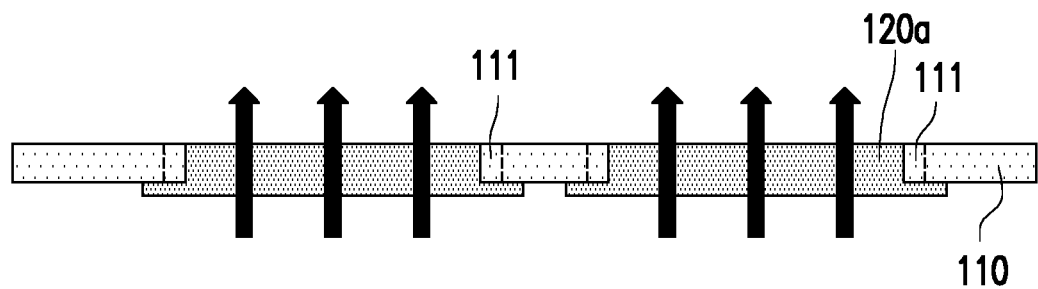
FIG. 9 is a top view of a fan expansion card in accordance with another embodiment of the invention.

FIG. 9 is a top view of a fan expansion card in accordance with another embodiment of the invention. Referring to FIG. 9, the fan expansion card of FIG. 8 is slightly different from the fan expansion card of FIG. 9, and the difference is that, in the present embodiment, the size of the through-holes 111 of the first circuit board 110 is slightly greater than the size of first fans 120a. Therefore, the first fans 120a may be disposed inside the through-holes 111 of the first circuit board 110. That is, at least a portion of the first fans 120a are extended into the through-holes 111. As such, the fan expansion card may have a smaller thickness.

Figure 10:
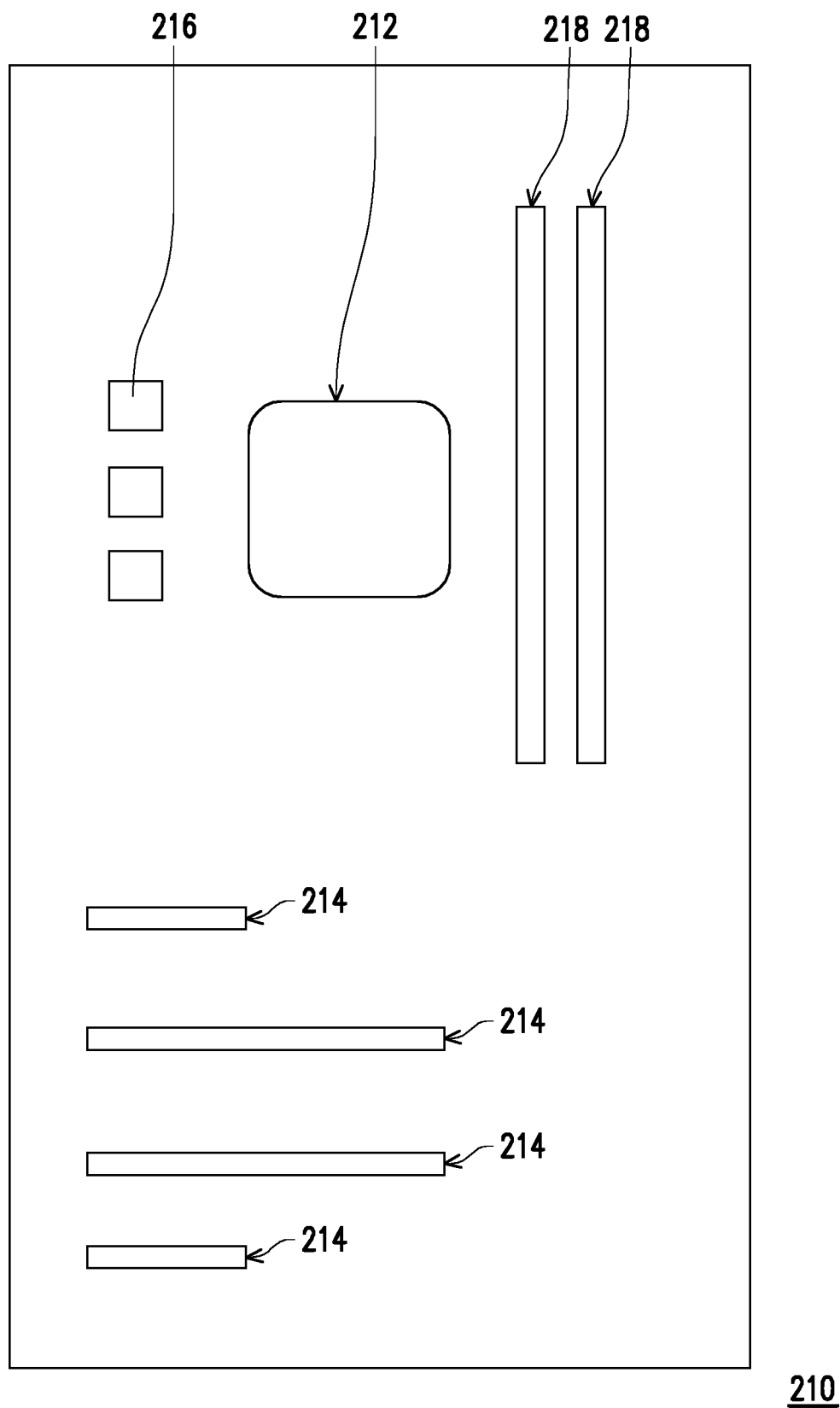
FIG. 10 is a top view of a motherboard body of a motherboard module in accordance with an embodiment of the invention.
Figure 11:
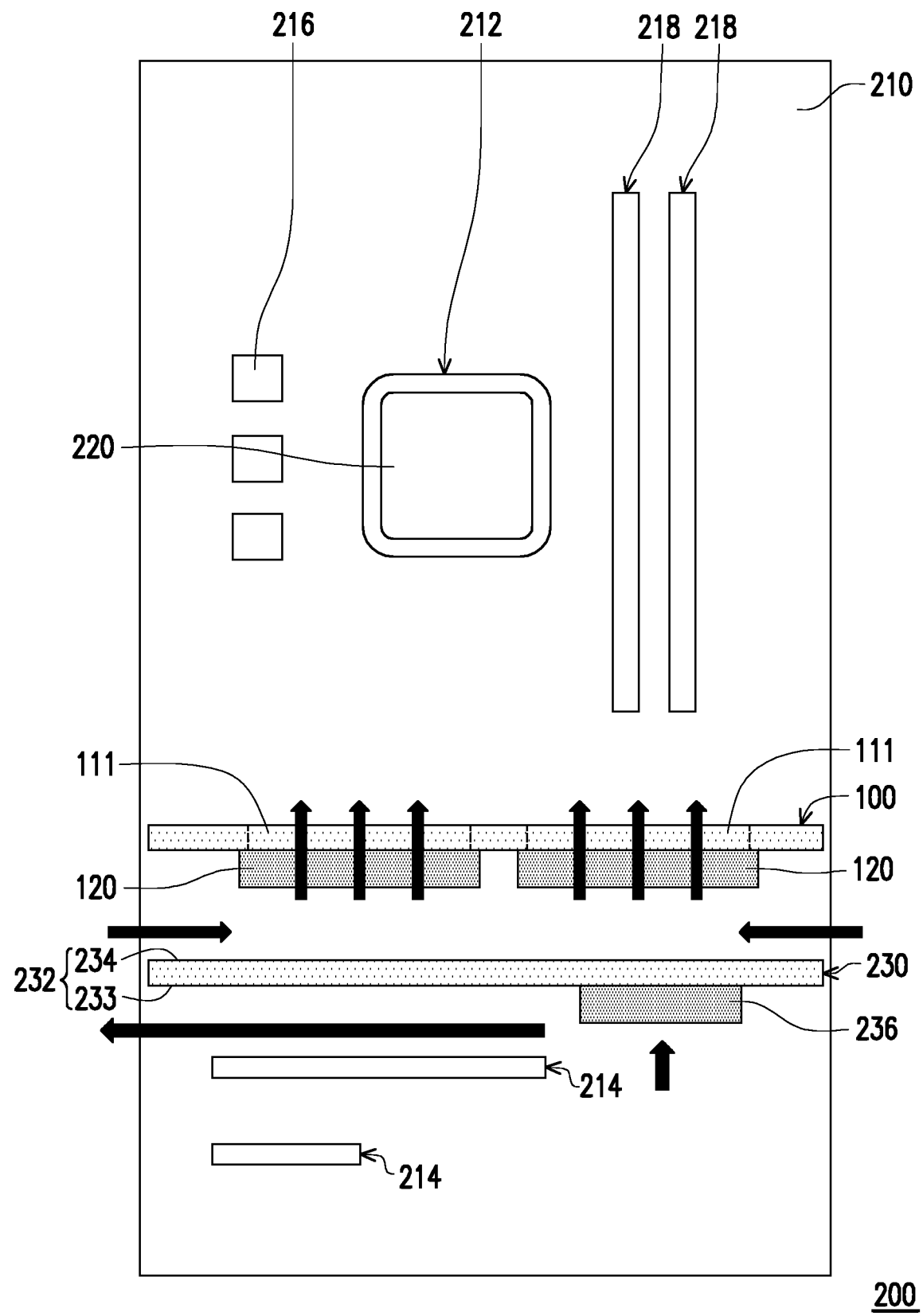
FIG. 11 is a top view of the motherboard module of FIG. 10.

Referring to FIG. 1, in the present embodiment, the first circuit board 110 of the fan expansion card 100 further includes a control chip 113 electrically connected to the first connection port 112 and the first fans 120. Specifically, when the first connection port 112 of the fan expansion card 100 is inserted on the PCI-E slot 214 (FIG. 10) of the motherboard body 210 (FIG. 10), the first connection port 112 of the fan expansion card 100 may receive a signal from the motherboard body 210 and transmit the signal to the control chip 113 such that the control chip 113 may control the rotating speed of the first fans 120 accordingly. For example, the control chip 113 may adjust the rotating speed of the first fans 120 according to the performance of a central processor 220 (FIG. 11) of a motherboard module 200 (FIG. 11). Of course, the basis for the control chip 113 to adjust the rotating speed of the first fans 120 is not limited thereto.

In addition, as shown in FIG. 1, in the present embodiment, the first circuit board 110 further includes the external power supply slot 114 electrically connected to the control chip 113. In the present embodiment, the power of the first fans 120 is mainly obtained by inserting the first connection port 112 in the PCI-E slot 214 (FIG. 10) of the motherboard body 210 (FIG. 10). When the number of the first fans 120 is greater or the rotating speed thereof is greater, in order to avoid insufficient power supplied by the PCI-E slot 214, the fan expansion card 100 may also obtain additional power by inserting a transmission line to the external power slot 114 and connecting the transmission line to a fan power supply slot (not shown) on the motherboard body 210.

In addition, in the present embodiment, the first circuit board 110 further includes the light source control circuit 115 electrically connected to the first connection port 112. The light source control circuit 115 includes, for example, a controller and a light source electrically connected to the controller. The light source is, for example, a light-emitting diode, but the type of the light source is not limited. In the present embodiment, the controller of the light source control circuit 115 may control the output effect of the light source according to the signal received from the first connection port 112. For example, the controller of the light source control circuit 115 may adjust the color or brightness of the light source according to the performance of the central processor 220 (FIG. 11) of the motherboard module 200 (FIG. 11). When the central processor 220 is in high performance operation, the light source of the light source control circuit 115 may emit red light. When the central processor 220 is in low performance operation, the light source of the light source control circuit 115 may emit blue light. Alternatively, in other embodiments, the light source control circuit 115 may also be electrically connected to the control chip 113 and change the color or brightness of the light source with the rotating speed of the first fans 120. For example, when the first fans 120 operate at a high rotating speed, the light source of the light source control circuit 115 may emit red light, and when the first fans 120 operate at a low rotating speed, the light source of the light source control circuit 115 may emit blue light.

The aspect when the fan expansion card 100 is applied to the motherboard body 200 is described below. FIG. 10 is a top view of a motherboard body of a motherboard module in accordance with an embodiment of the invention. FIG. 11 is a top view of the motherboard module of FIG. 10. Referring first to FIG. 10, in the present embodiment, the motherboard body 210 includes a central processor slot 212, a plurality of PCI-E slots 214 located on one side of the central processor slot 212, and a plurality of transistors 216 and a plurality of memory slots 218 disposed beside the central processor slot 212.

In the present embodiment, the central processor slot 212 and the memory slots 218 may be respectively inserted by the central processor 220 and memory modules (not shown). Therefore, the positions where the central processor slot 212 and the memory slots 218 are located are the positions of the heat sources. In addition, the transistors 216 also generate heat during operation. Therefore, when the motherboard module 200 (FIG. 11) is in operation, the side of the PCI-E slots 214 on the motherboard body 210 (e.g., the region in the top side of FIG. 10) needs to be heavily dissipated. In the present embodiment, the transistors 216 are, for example, power MOSFETs, but the type of the transistors 216 is not limited thereto.

In addition, as shown in FIG. 11, the motherboard module 200 includes a function expansion card 230, and the function expansion card 230 is, for example, a display card, but is not limited thereto. The function expansion card 230 also generates a large amount of heat due to a high load during operation. In the present embodiment, the function expansion card 230 further includes a second fan 236 disposed on a second circuit board 232. As may be seen from FIG. 11, the air blown by the second fan 236 flows along the surface of the second circuit board 232 to dissipate heat from the second circuit board 232 of the function expansion card 230 and exits toward the left in FIG. 11. In addition, in the present embodiment, the function expansion card 230 includes a second circuit board 232. The second circuit board 232 includes, for example, a PCI-E×8 or PCI-E×16 connection port. As seen in FIG. 11, the function expansion card 230 is disposed on the PCI-E slot 214 that is second closest to the central processor slot 212.

In general, the type of the PCI-E slots includes PCI-E×1, PCI-E×2, PCI-E×4, PCI-E×8, or PCI-E×16 slots, and the type of the PCI-E slots on the motherboard body varies depending on the need. However, on most motherboard bodies, the PCI-E slot closest to or farthest from the central processor slot is a PCI-E×1, PCI-E×2, or PCI-E×4 slot. In addition, in general, consumers mainly install a function expansion card such as a display card on a PCI-E slot, and a function expansion card such as a display card is usually inserted on the PCI-E×8 or PCI-E×16 slot due to a large operating load, and the PCI-E×8 or PCI-E×16 slot is usually the second or third PCI-E slot from the central processor slot 212. That is, the PCI-E×8 or PCI-E×16 slot is not disposed in the PCI-E slot closest to or farthest from the central processor slot 212. Therefore, the PCI-E slot on the motherboard body closest to or farthest from the central processor slot is usually idle.

Referring to FIG. 10 and FIG. 11, in the fan expansion card 100 of the present embodiment, since the PCI-E slot 214 on the motherboard body 210 closest to the central processor slot 212 is usually idle, the fan expansion card 100 is inserted onto, for example, the PCI-E slot 214 closest to the central processor slot 212 without affecting the installation of a function expansion card such as a general display card to dissipate heat from the central processor 220 located in the central processor slot 212 and the transistors 216.

Referring to FIG. 11, in the present embodiment, the central processor 220 of the motherboard module 200 is disposed on the central processor slot 212 of the motherboard body 210, and the fan expansion card 100 is disposed on one of the PCI-E slots 214, such as on the PCI-E slot 214 closest to the central processor slot 212. In the present embodiment, the first fans 120 of the fan expansion card 100 are, for example, direct blow fans. When the first fans 120 of the fan expansion card 100 are in operation, the airflow generated by the first fans 120 passes through the corresponding through-hole 111 and is adapted to be blown toward the direction of the central processor 220 and the transistors 216, and may even be blown toward the direction of the memory modules on the memory slots 218 to dissipate heat from the main heat source (the central processor 220) and the secondary heat sources (the transistors 216 and the memory modules) of the motherboard module 200.

In addition, in the present embodiment, the second circuit board 232 of the function expansion card 230 includes a front surface 233 and a back surface 234 opposite to each other. The second fan 236 is disposed on the front surface 233, and the back surface 234 faces the fan expansion card 100. The airflow driven by the first fans 120 of the fan expansion card 100 flows through the back surface of the second circuit board 232 of the function expansion card 230 to dissipate heat from the function expansion card 230. In other words, when the first fans 120 of the fan expansion card 100 are in operation, the airflow driven by the first fans 120 may flow from the back to the front, which may not only dissipate heat from the central processor 220 and the transistors 216 in the front, but airflow in the back may also flow along the back surface 234 of the second circuit board 232 of the function expansion card 230 to simultaneously dissipate heat from the function expansion card 230, so that the heat dissipation effect is faster.

Figure 12:
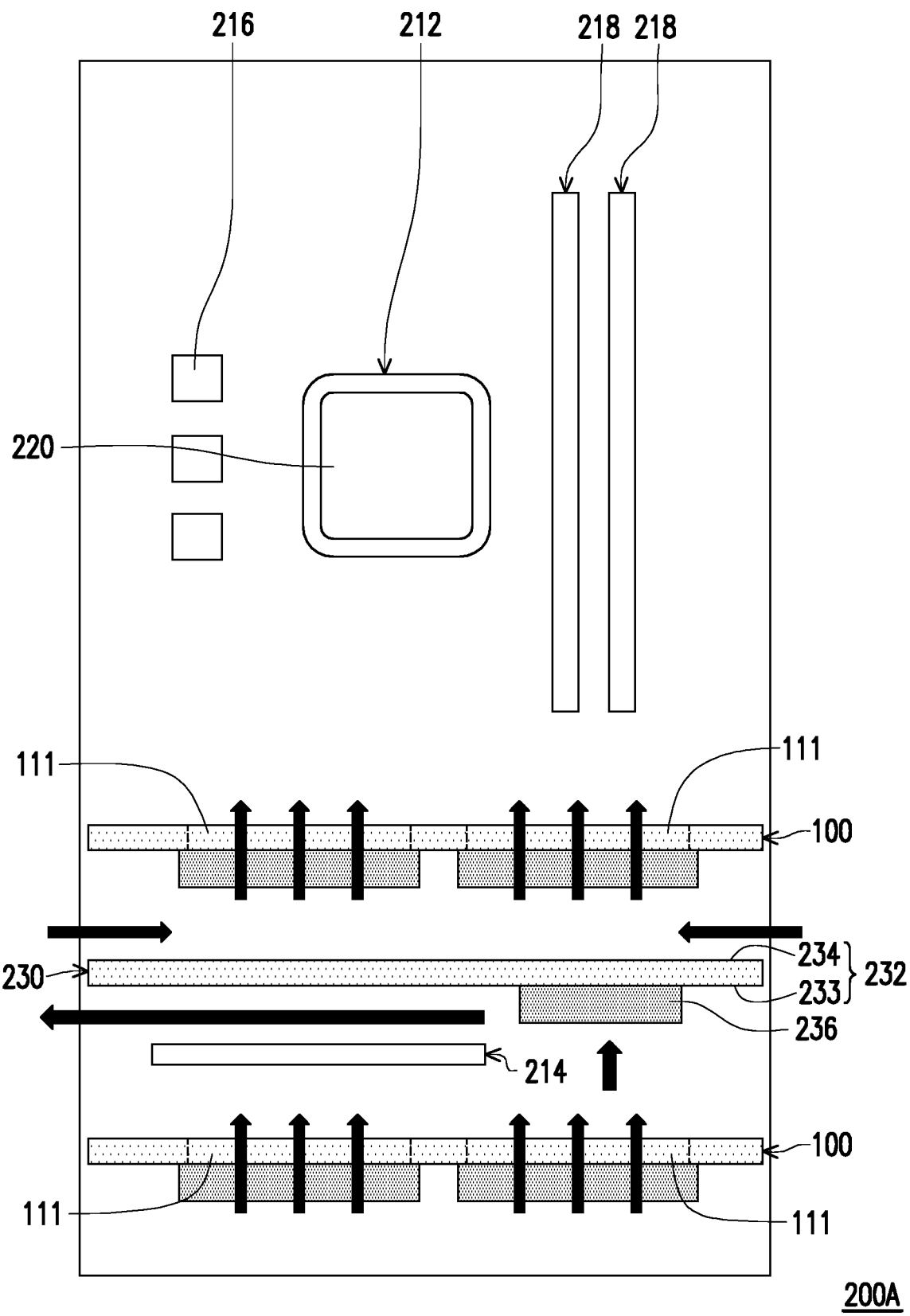
FIG. 12 is a top view of a motherboard module in accordance with another embodiment of the invention.

Of course, the configuration position of the fan expansion card 100 is not limited to the above. FIG. 12 is a top view of a motherboard module in accordance with another embodiment of the invention. Referring to FIG. 12, in the present embodiment, a motherboard module 200A is slightly different from the motherboard module 200. The difference is that the motherboard module 200A includes two fan expansion cards 100. One of the fan expansion cards 100 is inserted on the PCI-E slot 214 closest to the central processor slot 212. The airflow generated by the first fans 120 of the fan expansion card 100 may be blown toward the direction of the central processor 220, the transistors 216, and the memory modules on the memory slots 218 via the corresponding through-hole 111 to dissipate heat from the memory modules on the central processor 220, the transistors 216, and the memory slots 218.

In the present embodiment, the other fan expansion card 100 is inserted on the PCI-E slot 214 farthest from the central processor slot 212, and the airflow generated by the first fans 120 of the fan expansion card 100 passes through the corresponding through-hole 111 and is blown toward the direction of the function expansion card 230. That is to say, the air generated by the fan expansion card 100 inserted on the PCI-E slot 214 farthest from the central processor slot 212 may be blown toward the direction of the function expansion card 230 in a concentrated manner to further enhance the heat dissipation of the function expansion card 230.

It is worth mentioning that, although in the above embodiment, the fan expansion cards 100 are disposed on the PCI-E slots 214 closest to and/or farthest from the central processor slot 212, in other embodiments, the fan expansion cards 100 may also be disposed on other PCI-E slots 214, and may also dissipate heat from the heat source in the motherboard module.

Based on the above, the first connection port of the fan expansion card of the invention is a PCI-E interface connection port, which may be inserted on the PCI-E slot of the motherboard to receive power. That is, the motherboard may power the first fan of the fan expansion card via the PCI-E slot. In this way, the fan expansion card does not need to occupy the 3 pin fan power supply slot or 4 pin fan power supply slot on the motherboard, such that the motherboard module has more heat dissipation options. In addition, the first circuit board of the fan expansion card of the invention has a through-hole, and the first fan is disposed at a position on the first circuit board corresponding to the through-hole, so that the airflow generated by the first fan may pass through the corresponding through-hole. In other words, the air blown by the fan expansion card may travel along the normal direction of the first circuit board. When the fan expansion card of the invention is applied on the motherboard, if the PCI-E slot in which the fan expansion card is inserted is located beside the central processor slot and the transistors, the air blown by the fan expansion card is adapted to be blown toward the direction of the central processor and the transistors to cool the central processor and the transistors. In addition, in the motherboard module of the invention, the fan expansion card may not only dissipate heat from a main heat source such as a central processor, but may also dissipate heat from a secondary heat source such as a transistor to achieve good heat dissipation effect.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A fan expansion card, comprising:
a first circuit board having at least one through-hole and comprising a first connection port, wherein the first connection port has a PCI-E interface; and
at least one first fan disposed at a position on the first circuit board corresponding to the at least one through-hole and electrically connected to the first circuit board, wherein when each of the at least one first fan is in operation, an airflow generated by each of the at least one first fan passes through the corresponding through-hole,
wherein the first circuit board further comprises a control chip electrically connected to the first connection port and the at least one first fan, and the control chip is configured to control a rotating speed of the at least one first fan.

2. The fan expansion card of claim 1, wherein the first connection port is a PCI-E×1, PCI-E×2, PCI-E×4 or PCI-E×8 connection port.

3. The fan expansion card of claim 1, wherein an area of each of the at least one through-holes is between 50% and 100% of a size of the corresponding first fan.

4. The fan expansion card of claim 1, wherein the at least one through-hole of the first circuit board comprises a plurality of through-holes, the at least one first fan comprises a plurality of first fans, and the plurality of first fans are respectively disposed at positions corresponding to the through-holes.

5. The fan expansion card of claim 4, wherein the through-holes are arranged in a row, in a staggered arrangement, or in an array configuration.

6. The fan expansion card of claim 4, wherein sizes of the through-holes are the same or different, and sizes of the plurality of first fans are the same or different respectively corresponding to the sizes of the configured through-holes.

7. The fan expansion card of claim 1, wherein the at least one through-hole of the first circuit board comprises one through-hole, the at least one first fan comprises a plurality of first fans, an area of the through-hole is between 50% and 200% of a total size of the plurality of first fans, and the plurality of first fans are disposed at positions corresponding to the through-hole.

8. The fan expansion card of claim 1, wherein the first circuit board further comprises an external power supply slot electrically connected to the control chip.

9. A fan expansion card, comprising:
a first circuit board having at least one through-hole and comprising a first connection port, wherein the first connection port has a PCI-E interface; and
at least one first fan disposed at a position on the first circuit board corresponding to the at least one through-hole and electrically connected to the first circuit board, wherein when each of the at least one first fan is in operation, an airflow generated by each of the at least one first fan passes through the corresponding through-hole, wherein the first circuit board further comprises a light source control circuit electrically connected to the first connection port.

10. A motherboard module, comprising:

a motherboard body comprising a central processor slot, a plurality of PCI-E slots located on one side of the central processor slot, and a plurality of transistors disposed beside the central processor slot;

a central processor disposed in the central processor slot; and at least one of the fan expansion card of claim 1 detachably disposed in at least one of the PCI-E slots, wherein when each of the at least one first fan is in operation, an airflow generated by each of the at least one first fan passes through the corresponding through-hole and is adapted to be blown toward a direction of the central processor and the transistors.

11. The motherboard module of claim 10, wherein the at least one fan expansion card comprises a fan expansion card, the fan expansion card is inserted on the PCI-E slot closest to the central processor slot, and an airflow generated by the at least one first fan of the fan expansion card is blown toward the direction of the central processor and the transistors.

12. The motherboard module of claim 10, further comprising:

a function expansion card comprising a second circuit board, wherein the second circuit board comprises a second connection port, the second connection port has a PCI-E interface, the function expansion card is disposed on one of the PCI-E slots, and the PCI-E slot in which the function expansion card is inserted is not the PCI-E slot closest to the central processor slot.

13. The motherboard module of claim 12, wherein the at least one fan expansion card comprises two fan expansion cards, the function expansion card is located between the two fan expansion cards, one of the fan expansion cards is inserted on the PCI-E slot closest to the central processor slot, an airflow generated by the at least one first fan of the fan expansion card is blown toward the direction of the central processor and the transistors, the other fan expansion card is inserted on the PCI-E slot farthest from the central processor slot, and an airflow generated by the at least one first fan of the fan expansion card is blown toward a direction of the function expansion card.

14. The motherboard module of claim 12, wherein the function expansion card comprises a second fan disposed on the second circuit board, the second fan blows toward a direction of the second circuit board, and an airflow generated by the second fan flows along a surface of the second circuit board.

15. The motherboard module of claim 14, wherein the second circuit board of the function expansion card comprises a front surface and a back surface opposite to each other, the second fan is disposed on the front surface, the back surface faces the fan expansion card, and an airflow driven by the at least one first fan of the fan expansion card flows through the back surface of the second circuit board of the function expansion card.

* * * * *